United States Patent
Dani et al.

(10) Patent No.: US 10,177,762 B2
(45) Date of Patent: Jan. 8, 2019

(54) CAPACITIVE CONTROL ELEMENT WITH IMPROVED MALFUNCTION IMMUNITY

(71) Applicant: Preh GmbH, Bad Neustadt a.d. Saale (DE)

(72) Inventors: Alain Dani, Coburg (DE); Xiaoxi Li, Bad Neustadt (DE); Jochen Schlereth, Sondheim/Rhön (DE); Tobias Bodenstein, Salz (DE)

(73) Assignee: Preh GmbH, Bad Neustadt a.d. Saale (DE)

(*) Notice: Subject to any disclaimer, the term of this patent is extended or adjusted under 35 U.S.C. 154(b) by 66 days.

(21) Appl. No.: 15/241,420

(22) Filed: Aug. 19, 2016

(65) Prior Publication Data

US 2017/0052073 A1 Feb. 23, 2017

(30) Foreign Application Priority Data

Aug. 19, 2015 (DE) .......................... 10 2015 113 694

(51) Int. Cl.
*G01L 1/14* (2006.01)
*H03K 17/98* (2006.01)
*H03K 17/96* (2006.01)

(52) U.S. Cl.
CPC .............. *H03K 17/98* (2013.01); *G01L 1/142* (2013.01); *H03K 17/962* (2013.01);
(Continued)

(58) Field of Classification Search
CPC ................ H03K 17/98; H03K 17/962; H03K 2217/960755; H03K 2217/9653; H03K 2217/960785; G01L 1/42
(Continued)

(56) References Cited

U.S. PATENT DOCUMENTS 3,858,097 A * 12/1974 Polye .................... G01L 9/0086
                                                361/283.1
4,555,745 A * 11/1985 Westermeir .............. H01G 4/20
                                                361/320
(Continued)

FOREIGN PATENT DOCUMENTS

DE    10 2007 047 335 A1    4/2009
DE    11 2012 000 120 T5    10/2013

OTHER PUBLICATIONS

Office Action for corresponding DE 10 2015 113 694.5 dated Aug. 3, 2016.

*Primary Examiner* — Jonathan Dunlap
(74) *Attorney, Agent, or Firm* — Walter | Haverfield LLP; Sean F. Mellino; D. Peter Hochberg

(57) ABSTRACT

A control element comprising a support; a control part which defines at least one operating surface, which is movable or elastically yielding if an operating force F acts upon the operating surface; a layer structure that is disposed between the control part and the support and that is elastically deformed if an operating force F acts on the operating surface. The layer structure has at least one first electrode associated with the support and a second electrode, which is associated with the control part and disposed underneath the operating surface, for the definition of a measuring capacity varying in accordance with the operating force. The layer structure further has an intermediate layer having a recess which is disposed between the first and second electrodes for defining a hollow chamber; and means for venting the hollow chamber. The means for venting is integrated at least partially into the intermediate layer.

36 Claims, 3 Drawing Sheets

(52) U.S. Cl.
CPC ............... *H03K 2217/9653* (2013.01); *H03K 2217/960755* (2013.01); *H03K 2217/960785* (2013.01)

(58) Field of Classification Search
USPC .................................................. 345/173–174
See application file for complete search history.

(56) References Cited

U.S. PATENT DOCUMENTS

| | | | | |
|---|---|---|---|---|
| 4,562,315 | A | 12/1985 | Aufderheide | |
| 4,562,742 | A * | 1/1986 | Bell | G01L 19/0636 361/283.4 |
| 8,179,375 | B2 * | 5/2012 | Ciesla | G06F 3/0202 178/18.01 |
| 8,456,438 | B2 * | 6/2013 | Ciesla | G06F 3/0202 345/156 |
| 8,547,341 | B2 * | 10/2013 | Takashima | G06F 3/016 340/407.2 |
| 8,922,502 | B2 * | 12/2014 | Ciesla | G06F 3/0202 345/156 |
| 8,922,503 | B2 * | 12/2014 | Ciesla | G06F 3/0202 345/156 |
| 9,671,901 | B2 * | 6/2017 | Hashimoto | G06F 3/044 |
| 2005/0134580 | A1 * | 6/2005 | Sonoda | B32B 5/18 345/211 |
| 2006/0238510 | A1 * | 10/2006 | Panotopoulos | G06F 3/0202 345/168 |
| 2009/0160813 | A1 * | 6/2009 | Takashima | G06F 3/016 345/173 |
| 2009/0174673 | A1 * | 7/2009 | Ciesla | G06F 3/0202 345/173 |
| 2009/0174687 | A1 * | 7/2009 | Ciesla | G06F 3/04886 345/174 |
| 2010/0058865 | A1 * | 3/2010 | Zhang | G01P 15/0802 73/514.38 |
| 2010/0103137 | A1 * | 4/2010 | Ciesla | G06F 3/0202 345/174 |
| 2010/0171719 | A1 * | 7/2010 | Craig | G06F 3/0202 345/173 |
| 2010/0171720 | A1 * | 7/2010 | Craig | G06F 3/0202 345/173 |
| 2010/0177054 | A1 * | 7/2010 | Iida | G06F 3/046 345/173 |
| 2011/0001613 | A1 * | 1/2011 | Ciesla | G06F 3/016 340/407.2 |
| 2011/0012851 | A1 * | 1/2011 | Ciesla | G06F 1/1616 345/173 |
| 2011/0148793 | A1 * | 6/2011 | Ciesla | G06F 3/0202 345/173 |
| 2011/0157080 | A1 * | 6/2011 | Ciesla | G06F 3/0202 345/174 |
| 2011/0254672 | A1 * | 10/2011 | Ciesla | G06F 3/016 340/407.2 |
| 2011/0254709 | A1 * | 10/2011 | Ciesla | G06F 3/016 341/20 |
| 2011/0254789 | A1 * | 10/2011 | Ciesla | G06F 3/016 345/173 |
| 2012/0050167 | A1 * | 3/2012 | Krahenbuhl | G06F 1/169 345/169 |
| 2012/0092324 | A1 * | 4/2012 | Buchan | G02B 26/0833 345/418 |
| 2012/0098789 | A1 * | 4/2012 | Ciesla | G06F 3/044 345/174 |
| 2012/0193211 | A1 * | 8/2012 | Ciesla | G06F 3/0202 200/81 H |
| 2012/0200528 | A1 * | 8/2012 | Ciesla | G06F 3/0202 345/174 |
| 2012/0200529 | A1 * | 8/2012 | Ciesla | G06F 3/0202 345/174 |
| 2012/0206364 | A1 * | 8/2012 | Ciesla | G06F 3/04886 345/168 |
| 2012/0218213 | A1 * | 8/2012 | Ciesla | G06F 3/016 345/173 |
| 2012/0218214 | A1 * | 8/2012 | Ciesla | G06F 1/1616 345/173 |
| 2012/0223914 | A1 * | 9/2012 | Ciesla | G06F 3/0202 345/174 |
| 2012/0235935 | A1 * | 9/2012 | Ciesla | G06F 3/0202 345/173 |
| 2012/0242607 | A1 * | 9/2012 | Ciesla | G06F 3/0202 345/173 |
| 2012/0306787 | A1 * | 12/2012 | Ciesla | G06F 3/0202 345/173 |
| 2013/0241860 | A1 * | 9/2013 | Ciesla | G06F 3/0202 345/173 |
| 2014/0160063 | A1 * | 6/2014 | Yairi | G06F 3/044 345/174 |
| 2014/0160064 | A1 * | 6/2014 | Yairi | G06F 3/04895 345/174 |
| 2014/0174189 | A1 * | 6/2014 | Pan | G01L 9/0072 73/724 |
| 2015/0029126 | A1 * | 1/2015 | Ciesla | G06F 3/0202 345/173 |
| 2015/0091870 | A1 * | 4/2015 | Ciesla | G06F 3/0202 345/174 |
| 2015/0177872 | A1 * | 6/2015 | Kim | G06F 3/044 345/174 |
| 2015/0324040 | A1 * | 11/2015 | Ciesla | G06F 3/0202 345/174 |
| 2016/0054833 | A1 * | 2/2016 | Ciesla | G06F 3/0202 345/174 |
| 2016/0116357 | A1 * | 4/2016 | Pan | G01L 9/0072 73/724 |
| 2017/0177120 | A1 * | 6/2017 | Kyutoku | G06F 3/044 |

* cited by examiner

CAPACITIVE CONTROL ELEMENT WITH IMPROVED MALFUNCTION IMMUNITY

CROSS-REFERENCE TO RELATED APPLICATION

This application claims priority of German application Serial Number 10 2015 113 694.5 filed on Aug. 19, 2015, the entirety of which is incorporated herein by reference.

BACKGROUND OF THE INVENTION

Field of the Invention

The invention relates to a control element, particularly to a control element for a motor vehicle.

Description of the Prior Art

In control elements used in motor vehicles, there is generally a demand for weight and space-saving designs. Furthermore, the control elements need to have a high degree of reliability and long-term stability and must be able to withstand comparatively large temperature fluctuations. Already for this reason, such designs are preferred in which the number of the mechanically cooperating components is reduced. Furthermore, mechanically sophisticated designs harbor the risk of injury to passengers in the case of a vehicle crash. For the above-mentioned reasons, control elements are currently preferred in which a capacitive evaluation of the operation is carried out. This measuring method entails that the measuring capacity connected therewith is susceptible to malfunction, not only to interfering electromagnetic radiation, for example. Particularly if an open air chamber is provided between the electrodes used for this purpose, there is the problem that the measuring capacity may vary due to entering dirt or liquid or moisture, and that the function of the control element is disrupted.

Therefore, there is a demand for a control element with capacitive detection which is more immune to malfunction, with the advantages of a high integration density, low wear and low weight being maintained at the same time. This object is achieved with a control element according to claim 1. Advantageous embodiments are in each case the subject matter of the dependent claims. It must be noted that the features cited individually in the claims can be combined with each other in any technologically meaningful manner and represent other embodiments of the invention. The description, in particular in connection with the figures, additionally characterizes and specifies the invention.

SUMMARY OF THE PRESENT INVENTION

The invention relates to a control element having a support. The term support is to be construed broadly. For example, it defines a contact surface for at least one further component of the control element provided in accordance with the invention, for example for the layer structure described below. The contact surface is, for example, planar or curved in at least one direction. The material of the support comprises, for example, a plastic, such as a thermoplastic material. The control element further has a control part which defines at least one operating surface, which is movable or elastically yielding if an operating force acts upon the operating surface. For example, the control part is a continuous layer made from an elastically deformable material, wherein the operating surface is embedded and marked in the surface defined by the layer only by visual and/or haptic boundaries. According to another embodiment, the operating surface is connected to the remaining rest of the control part with a film hinge.

Furthermore, a layer structure that is disposed between the control part and the support and that is elastically deformed if an operating force acts on the operating surface is provided according to the invention.

According to the invention, the layer structure has at least one first electrode associated with the support and a second electrode, which is associated with the control part and disposed underneath the operating surface, for the definition of a measuring capacity varying in accordance with the operating force. The measuring capacity is provided, for example, in order to detect a change in the measuring capacity by means of an evaluation unit, so that this change can be associated with a control or switching function. Preferably, ground potential is applied to the second electrode by the evaluation unit.

Further, the layer structure according to the invention has an intermediate layer having a recess which is disposed between the first and second electrodes for defining a hollow chamber, which is thus deformed upon operation. Viewed in the direction of the operating force, the hollow chamber is disposed underneath the operating surface. The outer circumference of the hollow chamber in the plane perpendicular to the operating force has, for example, a shape that corresponds to that of the outer circumference of the operating surface, with the two shapes not necessarily having to be congruent. For example, the hollow chamber has dimensions that correspond to that of the operating surface or that exceed the dimensions thereof. For example, the hollow chamber is produced by punching out the intermediate layer. For example, the hollow chamber is delimited by further layers of the layer structure or by the support or the control part itself. The hollow chamber is provided in order to be able to cause the electrodes to come comparatively close to each other upon operation and thus to cause a strong change in the measuring capacity.

According to the invention, means for venting the hollow chamber are also provided, the means for venting being integrated at least partially into the layer structure, particularly into the intermediate layer. This integration into the intermediate layer ensures that the venting of the hollow chamber, which is required for the latter's compression during the operation or the expansion during the elastic recovery when the operation is discontinued, is carried out via a prescribed path, particularly duct. Given a suitable positioning of the inlet and outlet opening of these means, the risk can thus be minimized that dirt or liquid or moisture, which affect the measuring capacity, enter the hollow chamber.

For example, this inlet and outlet opening is not provided in the control part. According to one embodiment, this inlet and outlet opening is provided in the layer structure, for example in an exposed edge of the intermediate layer; preferably, it is disposed on the side of the support facing away from the control part, wherein, for example, a duct opening into the inlet and outlet opening extends through the support.

According to a preferred embodiment, the means for venting comprise a microporous membrane. Microporous membrane means a pore opening of less than 1 micrometer, preferably of less than 0.20 micrometer, still more preferably less than or equal to 0.07 micrometer. For example, it is a stretched polypropylene film. For example, calcium carbonate was introduced during the manufacturing process for forming pores. Preferably, the membrane is made from hydrophobic and/or oleophobic material or has such a coating. Preferably, a membrane having polytetrafluoroethylene is provided. The microporous membrane prevents dirt particles with a correspondingly larger particle diameter and liquids in the liquid phase from entering the hollow chamber. The membrane can be integrated into the intermediate layer. An arrangement covering the inlet and outlet opening is preferred.

According to a preferred embodiment, the first and second electrodes have a grid structure, i.e. a structure with through-holes, preferably a regular grid structure, and the remaining layers of the layer structure are configured to be translucent or transparent at least in the region of the measuring capacity in order thus to enable a transmission of light through the layer structure for a surface to be backlit in the operating surface, such as a symbol. For example, a lighting means, such as an LED, is disposed on the side of the support facing towards the control part. Preferably, the through-holes of the grids of the first and second electrodes are disposed so as to alternately cover each other, for example, in alignment. The grid structure not only has the ad vantage of a transmission of light through it, but is also advantageous in that, given the same elastic deformation in the case of an enlarged surface covered by the electrode, the change in measuring capacity becomes larger and thus, the susceptibility of the operation detection is increased.

For example, the second electrode covers a larger surface compared with die first electrode in order to obtain a better electromagnetic shielding of the measuring capacity.

For a better electromagnetic shielding, the regular grid structure of the second electrode has through-holes with a smaller cross section compared with the first electrode.

Preferably, the layer structure has a third electrode, preferably also a fourth electrode, which is disposed adjacent to the hollow chamber or adjacent to another hollow chamber disposed in the intermediate layer, which is, for example, connected to the above-mentioned hollow chamber in a fluid-conducting manner. This third electrode, optionally together with a fourth one, is disposed laterally offset to the operating surface relative to a direction perpendicular to the operating surface, and defines a reference capacity. For example, the reference capacity is formed by the electrical field between the third and second electrodes or by the electrical field between the third and fourth electrodes. For example, the evaluation unit evaluates the reference capacity in order to be able to eliminate influences due to changes in the air located in the hollow chamber or other particles, without a calibration step being necessary if just the measuring capacity were available for evaluation. For example, the shape of the surface area occupied by the third or fourth electrodes is round or quadrangular. According to another embodiment, the third or the fourth electrode is configured as a loop line, which defines the measuring capacity and surrounds the first or second electrodes.

In order to improve the calibration accuracy, a plurality of surfaces connected in an electrically conductive manner, which define the third electrode of the reference capacity, is provided for each measuring capacity. If provided, the fourth electrode has a corresponding number of surfaces connected in an electrically conductive manner. Preferably, the surfaces associated with the third or fourth electrodes are disposed uniformly distributed around the first and second electrodes.

For a better adaptation to the elastic deformation of the layer structure caused by a finger, the surface area occupied by the third electrode is smaller than the surface area occupied by the first electrode, and/or the surface area occupied by the third electrode has an extension in at least one direction that is less than 1.0 cm, preferably less than 0.75 cm, still more preferably less than 0.50 cm. Those conductive surfaces that are disposed offset to the hollow chamber relative to the operating direction and/or that have a maximum dimension of less than 1 mm are understood to be recessed supply lines.

Preferably, the third and the optionally provided fourth electrode have a closed surface in order to provide, with a comparatively small dimension, the reference capacity, in particular a reference capacity adapted to the measuring capacity.

Preferably, the means for venting have at least one fluid-conducting duct.

It is preferably provided that the operating part defines a plurality of operating surfaces and the layer structure has at least a plurality of first electrodes, to each of which is assigned one, preferably separate, measuring capacity. For example, each measuring capacity is vented via an assembly of ducts. The ducts may open into a common inlet and outlet opening.

Preferably, a plurality of separate hollow chambers and separate means for venting are associated with the plurality of measuring capacities. Separate means for venting means that a number of inlet and outlet openings corresponding to the number of the measuring capacities is provided.

Preferably, the layer structure has at least one first and second film made of a non-electric material, to which the first and second and, optionally, the third and fourth electrodes are applied. For example, the electrodes are disposed on the film by means of printing with a conductive material, such as ITO, PEDOT, silver, gold. For example, the films are provided with printing on the side facing away from or towards the hollow chamber. Particularly in the case of an arrangement on the side facing towards the hollow chamber, an insulating protective layer covering the respective electrode towards the hollow chamber, for example made from a UV curing lacquer, is provided.

Preferably, the conductive layer of at least the first and second electrodes is translucent or transparent; for example, this is achieved by means of the thickness of the application of the layer, or preferably, by the conductive material being translucent or transparent.

Preferably, this is a flexible film, layer structure, i.e. the layer structure substantially consists of layered flexible films that are preferably connected by substance-to-substance connection. Preferably, at least one film is a PET or acetate film.

In addition to the films, the film layer structure preferably has at least one adhesive layer, such as an acrylate adhesive layer, which is disposed between the first film and the intermediate layer and adjacent thereto and/or between the second film and the intermediate layer and adjacent thereto.

Furthermore, the invention relates to the use of the control element in one of the above described embodiments in a motor vehicle.

BRIEF DESCRIPTION OF THE DRAWINGS

The invention is explained further with reference to the following figures. The Figures are to be understood only as examples and merely represent a preferred embodiment. In the drawings.

DETAILED DESCRIPTION OF THE PRESENT INVENTION

Figure 1:
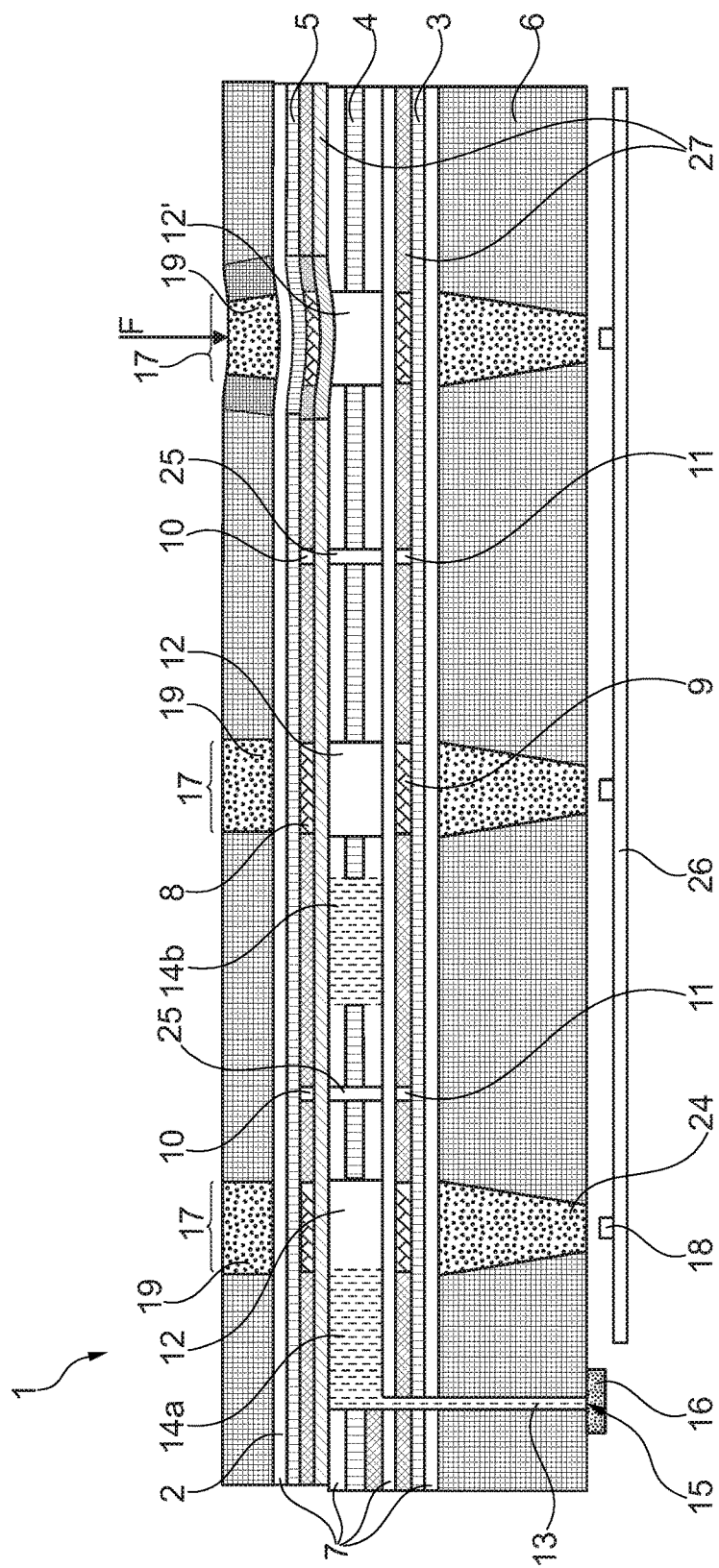
FIG. 1 shows a sectional view of the essential component parts of an embodiment of the control element 1 according to the invention.

FIG. 1 shows a sectional view of the control element 1 according to the invention, with, however, only a portion of the overall structure being shown. The control element 1 has an upper control part 2 facing towards the operator. The control part 2 defines several operating surfaces 17. The control part 2 is substantially formed from a thermoplastic material and elastically deformable in the region of the operating surfaces 17. Within the operating surfaces 17, a luminous surface 19 made of translucent material is provided, which can be backlit and depicts a symbol. An alternative embodiment would also be conceivable in which a luminous surface 19 is produced by an opaque mask that corresponds to the symbol and is applied to one side of the, on the whole, translucent control part 2, which will not be addressed in any detail here. From the viewing direction of the operator, a flexible film layer structure 3, 4, 5, 7 is provided underneath the operating part 2 and adjacent thereto.

A comparatively rigid support 6 is provided underneath the film layer structure 3, 4, 5, 7. Under the influence of an operating force F acting on the operating surface 17, the film layer structure 3, 4, 5, 7 undergoes an elastic deformation. For a specific elastic deformation of the operating part 2 at a predetermined location, i.e. in the region of the operating surface 17 of the film layer structure 3, 4, 5, 7, hollow chambers 12, 12' are incorporated therein, in each case at a location corresponding to the operating surface 17 and in a shape and dimension corresponding to the operating surface 17 or exceeding it. As shown on the hollow chamber 12', the hollow chamber 12' is subjected to a deformation upon operation. In order to be able to assign a switching function to the extent of the deformation of the respective hollow chamber 12, 12', one first electrode 9 and one second electrode 8 made of a conductive material are provided, respectively, on the upper and lower adjacent walls of the hollow chamber 12. In this case, the first electrode 9 is disposed underneath the second electrode 8, and both are disposed underneath the operating surface 17. An electrical field is applied to both of them by an electronic evaluation system that is not shown, via the supply lines 27, in order to define one measuring capacity per pair of first 9 and second 8 electrodes, which varies with the operating force due to the deformation of the hollow chamber and the increasing closeness of the first 9 and second 8 electrodes resulting therefrom with the operating force F, A switching function can be assigned to this variation by the evaluation unit upon a predetermined value being exceeded. When an electrical field is applied, ground potential is applied to the second electrode 8, for improved shielding against external electromagnetic interfering fields. The layers 3, 4, 5 of the layer structure are non-positively connected to each other by means of adhesive layers 7.

A reference capacity defined by the third electrode 11 and the second electrode 10 is moreover provided offset from the two electrodes 8, 9 that respectively define the measuring capacity. These electrode 10, 11 are also disposed closely adjacent to the hollow chamber 12 or a separate chamber, which is also formed by the intermediate layer 4 and connected in a fluid-conducting manner to at least the aforementioned hollow chamber 12, but, viewed in the operating direction, offset relative to the operating surface 17. The reference capacity, which, if possible, is not influenced, or at least only to a small extent, by the deformation upon operation is provided also to be evaluated by the evaluation unit which is not shown, in order be able to eliminate from the measuring capacity the dielectric properties of the air located in the hollow chamber, which change due to environmental influence, and the influences resulting therefrom on the measuring capacity, by means of one or more measuring steps and using the reference capacity. All of the electrodes 8, 9, 10, 11 of the layer structure are produced by a unilateral printing on an associated transparent film 3, 5. In this case, the second 8 and fourth 10 electrodes are printed on the upper film 5, and the first 9 and third 11 electrodes are printed on the lower film 3, wherein the printed sides are disposed facing each other and the intermediate layer 4, or the hollow chamber 12, 12' provided therein.

Means 12, 13, 14, 15, 16 for venting the hollow chamber 12, 12' are provided for pressure compensation upon deformation. These means comprise a duct 13 located in the support 6 and opening into an inlet and outlet opening 15, which is disposed on the side of the support 6 facing away from the control part 2. Furthermore, the opening 15 is covered with a microporous membrane 16 in order to inhibit the entry of dust and fluids into the duct 13. The duct 13 comprises a duct section 14a located in the intermediate layer 4 and a duct section 14b, which serves for the fluid-conducting connection of the hollow chambers 12, 12'.

Figure 2:
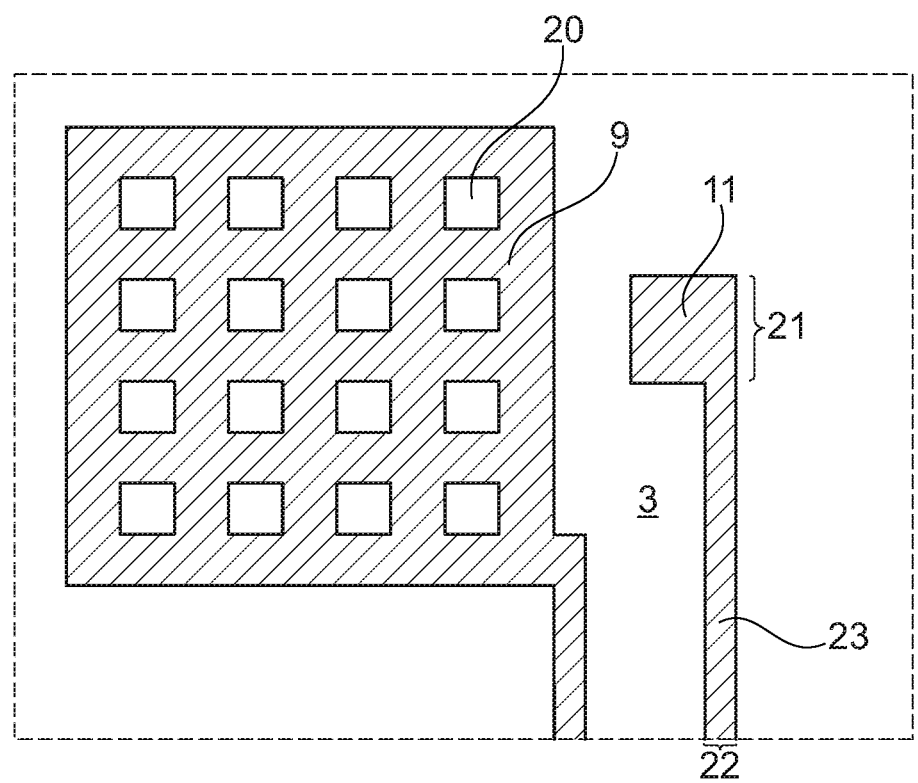
FIG. 2 shows a top view onto the layer 3 of the layer structure of the control element 1 according to the invention from FIG. 1, which layer is associated with the support 6.

The shape of the first 9 and third 11 electrodes will be explained with reference to FIG. 2. The first electrode 9 associated with the measuring capacity has a regular grid structure with through-holes 20. The second electrode 8, which is not shown additionally, has the same surface area coverage and is disposed overlapping the first electrode 9 in such a way that their through-holes are aligned in pairs, so that, as shown in FIG. 1, light of a light source 18 disposed under the support 6 on a circuit board 26 is able to arrive, in each case via a light guide 24 integrated into the support 6, through the through-holes 20 of the first 9 and second 8 electrodes and penetrating the transparent films 3 and 5, at the luminous surface 19 in order to backlight the latter for displaying a function symbol.

The third electrode 11 associated with the reference capacity has a maximum dimension 21, which is less than 1 cm. As intended, the supply line 23 is in this case supposed to be disregarded because its line width is less than 0.5 mm.

Figure 3:
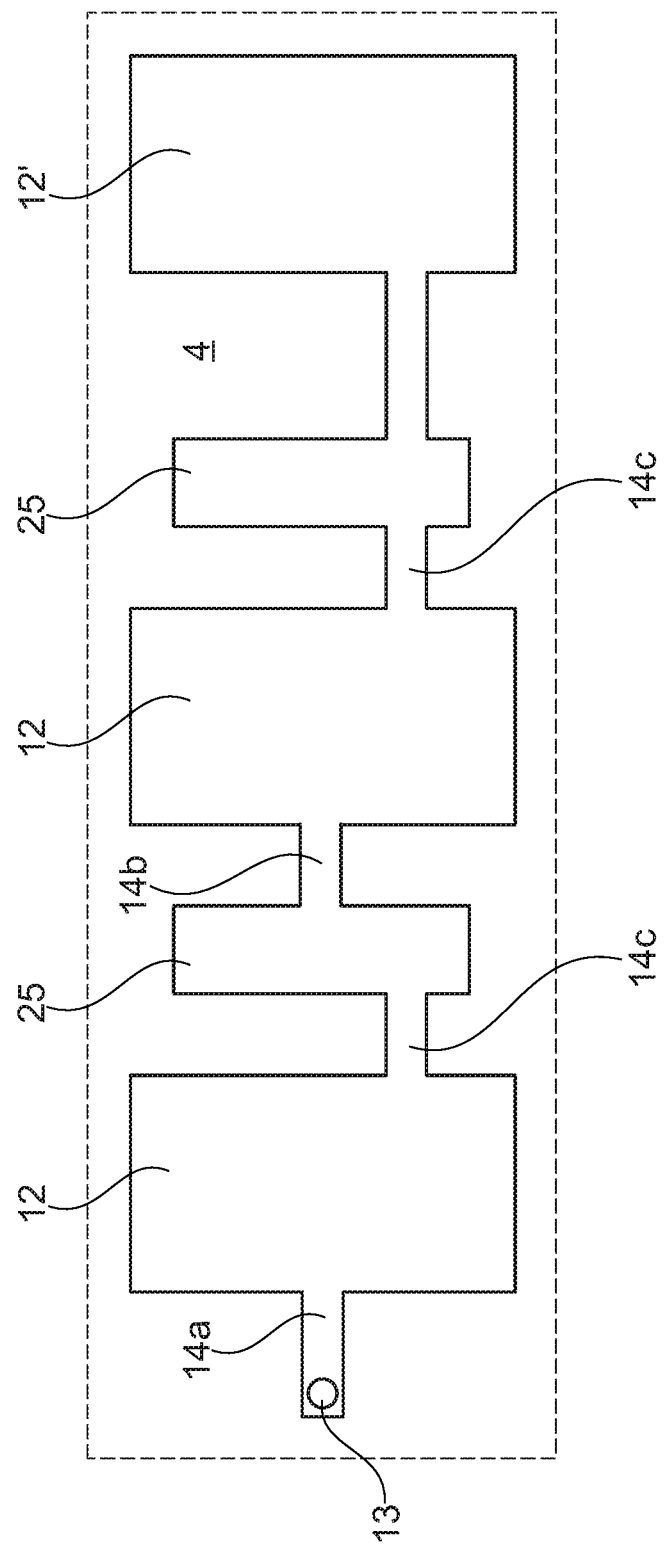
FIG. 3 shows a top view onto the intermediate layer 4 of the layer structure of the control element 1 according to the invention from FIG. 1.

The structure of the intermediate layer 4 is to be explained with reference to FIG. 3. This is a flexible film provided on both sides with an adhesive layer. It has a thickness of 125 μm. The hollow chambers 12, 12' associated with the measuring capacities and the hollow chambers 25 associated with the reference capacities, including the duct sections 14a, 14b and 14c for the fluid-conducting connection of the hollow chamber 12, 12', 25 to one another and for venting via the duct 13 disposed in the support, are formed by punched-out portions in the intermediate layer 4 and by covering with the adjacent films 3 and 5. The duct portions 14a, 14b, 14c are to be understood only as examples. Other embodiments, for example, duct sections that extend starting from the duct section 13 in the intermediate layer 4 located in the support 6, fully separate from the individual hollow chambers 12, are also conceivable.

What has been described above are preferred aspects of the present invention. It is of course not possible to describe every conceivable combination of components or methodologies for purposes of describing the present invention, but, one of ordinary skill in the art will recognize that many further combinations and permutations of the present invention are possible. Accordingly, the present invention is intended to embrace all such alterations, combinations, modifications, and variations that fall within the spirit and scope of the appended claims.

The invention claimed is:

1. A control element, comprising:
a support;
a control part for defining at least one operating surface, which is movable or elastically yielding if an operating force F acts upon the at least one operating surface;
a flexible film layer structure, having at least one film, that is disposed between the control part and the support and that is elastically deformed if an operating force F acts on the at least one operating surface;
wherein the layer structure has at least one first electrode associated with the support and at least one second electrode, which is associated with the control part and disposed underneath the at least one operating surface, for the definition of at least one measuring capacity associated with each first electrode, varying in accordance with the operating force, and wherein the layer structure further has an intermediate layer having at least one recess which is disposed between the first and second electrodes for defining at least one hollow chamber;
at least one means for venting each hollow chamber, each of the means for venting being integrated at least partially into the intermediate layer;
wherein the layer structure has at least one third electrode, preferably also at least one fourth electrode, which is disposed adjacent to one of the hollow chambers or adjacent to another hollow chamber disposed in the intermediate layer, but in both cases laterally offset to the at least one operating surface relative to a direction perpendicular to the at least one operating surface, and which defines at least one reference capacity, wherein at least one from the first to fourth electrodes is produced by printing a conductive material on the at least one film of the layer structure;
wherein each of the first and third electrodes have a surface area, and wherein the surface area occupied by each third electrode is smaller than the surface area occupied by each first electrode, and/or the surface area occupied by each third electrode has an extension in at least one direction that is less than 1.0 cm; and
wherein each third and each optionally provided fourth electrode have a closed surface.

2. The control element according to claim 1, wherein the means for venting comprise a microporous membrane.

3. The control element according to claim 2, wherein the means for venting comprise at least one selected from the group consisting of a hydrophobic membrane and an oleophobic membrane.

4. The control element according to claim 3, wherein the means for venting comprise a membrane comprising polytetrafluoroethylene.

5. The control element according to claim 1, wherein the first and second electrodes have a, preferably regular, grid structure, and the possibly remaining layers of the layer structure are configured to be translucent or transparent at least in the region of one of the at least one measuring capacity.

6. The control element according to claim 5, further comprising through-holes of the regular grid structures of the first and second electrodes being disposed to overlap and wherein the through-holes of the second electrode have a smaller cross section compared with the through-holes of the first electrode.

7. The control element according to claim 1, wherein a plurality of surfaces connected in an electrically conductive manner, which define the third electrode of the reference capacity, is provided for each measuring capacity.

8. The control element according to claim 1, wherein the means for venting comprise at least one fluid-conducting duct.

9. The control element according to claim 1, wherein the means for venting comprise an inlet and outlet opening disposed on the side of the support facing away from the control part.

10. The control element according to claim 1, wherein the control part defines a plurality of operating surfaces and the layer structure has at least a plurality of first electrodes, to each of which is assigned one measuring capacity.

11. The control element according to claim 10, wherein a plurality of separate hollow chambers and separate means for venting are associated with the plurality of measuring capacities.

12. The control element according to claim 1, wherein the at least one film is a film selected from the group consisting of a PET film and an acetate film.

13. The control element according to claim 12, wherein the film layer structure has at least one adhesive layer.

14. The control element according to claim 13, wherein the at least one adhesive layer is an acrylate adhesive layer.

15. The control element according to claim 1, wherein at least the support defines a contact surface for the layer structure which is curved in at least one direction.

16. The control element according to claim 1, wherein the extension in at least one direction is less than 0.75 cm.

17. The control element according to claim 16, wherein the extension in at least one direction is less than 0.50 cm.

18. The control element according to claim 1, wherein said conductive material is a material selected from the group consisting of a translucent material and a transparent material.

19. The control element according to claim 1, wherein the at least one hollow chamber venting means comprises an inlet and outlet opening disposed on the side of the support facing away from the control part.

20. A control element, comprising:
a support;
a control part for defining at least one operating surface, which is movable or elastically yielding if an operating force F acts upon the at least one operating surface;
a flexible film layer structure, having at least one film that is disposed between the control part and the support and that is elastically deformed if an operating force F acts on the at least one operating surface;
wherein the layer structure has at least one first electrode associated with the support and at least one second electrode, which is associated with the control part and disposed underneath the at least one operating surface, for the definition of at least one measuring capacity associated with each first electrode, varying in accordance with the operating force, and wherein the layer structure further has an intermediate layer having at least one recess which is disposed between the first and second electrodes for defining at least one hollow chamber;
at least one hollow chamber venting means being integrated at least partially into the intermediate layer;

wherein the layer structure has at least one third electrode, preferably also at least one fourth electrode, which is disposed adjacent to one of the hollow chambers or adjacent to another hollow chamber disposed in the intermediate layer, but in both cases laterally offset to the at least one operating surface relative to a direction perpendicular to the at least one operating surface, and which defines at least one reference capacity, wherein at least one from the first to fourth electrodes is produced by a conductive material on the at least one film of the layer structure;

wherein each of the first and third electrodes have a surface area, and wherein the surface area occupied by each third electrode is smaller than the surface area occupied by each first electrode, and/or the surface area occupied by each third electrode has an extension in at least one direction that is less than 1.0 cm; and wherein each third and each optionally provided fourth electrode have a closed surface.

21. The control element according to claim 20, wherein the at least one hollow chamber venting means comprises a microporous membrane.

22. The control element according to claim 21, wherein the at least one hollow chamber venting means comprises at least one selected from the group consisting of a hydrophobic membrane and an oleophobic membrane.

23. The control element according to claim 22, wherein the at least one hollow chamber venting means comprises a membrane comprising polytetrafluoroethylene.

24. The control element according to claim 20, wherein the first and second electrodes have a, preferably regular, grid structure, and the possibly remaining layers of the layer structure are configured to be translucent or transparent at least in the region of one of the at least one measuring capacity.

25. The control element according to claim 24, further comprising through-holes of the regular grid structures of the first and second electrodes being disposed to overlap and wherein the through-holes of the second electrode have a smaller cross section compared with the through-holes of the first electrode.

26. The control element according to claim 20, wherein a plurality of surfaces connected in an electrically conductive manner, which define the third electrode of the reference capacity, is provided for each measuring capacity.

27. The control element according to claim 20, wherein the at least one hollow chamber venting means comprises at least one fluid-conducting duct.

28. The control element according to claim 20, wherein the control part defines a plurality of operating surfaces and the layer structure has at least a plurality of first electrodes, to each of which is assigned one measuring capacity.

29. The control element according to claim 28, wherein a plurality of separate hollow chambers and separate hollow chamber venting means are associated with the plurality of measuring capacities.

30. The control element according to claim 20, wherein the at least one film is a film selected from the group consisting of a PET film and an acetate film.

31. The control element according to claim 30, wherein the film layer structure has at least one adhesive layer.

32. The control element according to claim 31, wherein the at least one adhesive layer is an acrylate adhesive layer.

33. The control element according to claim 20, wherein at least the support defines a contact surface for the layer structure which is curved in at least one direction.

34. The control element according to claim 20, wherein the extension in at least one direction is less than 0.75 cm.

35. The control element according to claim 34, wherein the extension in at least one direction is less than 0.50 cm.

36. The control element according to claim 20, wherein said conductive material is a material selected from the group consisting of a translucent material and a transparent material.

* * * * *